US009310046B2

(12) United States Patent
Ohta et al.

(10) Patent No.: US 9,310,046 B2
(45) Date of Patent: Apr. 12, 2016

(54) LIGHT EMITTING MODULE AND LIGHTING DEVICE USING THE SAME

(71) Applicant: Panasonic Corporation, Osaka (JP)

(72) Inventors: Takashi Ohta, Osaka (JP); Osamu Tanahashi, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 124 days.

(21) Appl. No.: 14/334,065

(22) Filed: Jul. 17, 2014

(65) Prior Publication Data

US 2015/0023024 A1    Jan. 22, 2015

(30) Foreign Application Priority Data

Jul. 19, 2013  (JP) ................................. 2013-150609

(51) Int. Cl.
| H01L 33/58 | (2010.01) |
| F21V 7/00 | (2006.01) |
| G02F 1/01 | (2006.01) |
| G02F 1/1335 | (2006.01) |
| H01L 51/52 | (2006.01) |
| F21Y 105/00 | (2006.01) |

(52) U.S. Cl.
CPC ............ *F21V 7/0008* (2013.01); *G02F 1/0105* (2013.01); *G02F 1/133605* (2013.01); *H01L 51/5268* (2013.01); *H01L 51/5271* (2013.01); *F21Y 2105/006* (2013.01); *F21Y 2105/008* (2013.01); *G02F 1/133611* (2013.01)

(58) Field of Classification Search
CPC ............ H01L 51/5271; H01L 51/5268; F21Y 2105/008; F21Y 2105/006; F21V 7/0008
See application file for complete search history.

(56) References Cited

U.S. PATENT DOCUMENTS

| 8,080,939 B2* | 12/2011 | Nomura ........... B29D 11/00596 313/506 |
| 2007/0108900 A1* | 5/2007 | Boek .................... G02B 5/0226 313/506 |
| 2011/0198654 A1* | 8/2011 | Naya .................... H01L 51/5268 257/98 |
| 2012/0199869 A1 | 8/2012 | Tsurume |
| 2014/0160411 A1* | 6/2014 | Yim .................. G02F 1/133553 349/113 |
| 2014/0376222 A1* | 12/2014 | Heinrich ............. B60Q 3/0283 362/235 |

FOREIGN PATENT DOCUMENTS

| JP | 2011-108568 | 6/2011 |
| JP | 2012-182129 | 9/2012 |

* cited by examiner

*Primary Examiner* — Peggy Neils
(74) *Attorney, Agent, or Firm* — Renner, Otto, Boisselle & Sklar, LLP

(57) ABSTRACT

A light emitting module includes a surface emitting panel and an optical member located at the light emitting surface side of the surface emitting panel. The surface emitting panel has a light emitting region and a non-light emitting region. The optical member has a reflector in the region corresponding to the light emitting region. The reflector has a reflectivity distribution in which the average reflectance per unit area varies. According to this configuration, light emitted from the surface emitting panel and guided by the optical member is reflected by the reflector and emitted in front of the non-light emitting region. By this way, a region in front of the non-light emitting region is difficult to be dark, thus allowing the light emission area to be increased. Further, where a number of light emitting modules are arranged in a matrix as a lighting device, a uniform illumination surface is provided.

10 Claims, 6 Drawing Sheets

(a)

(b)

LIGHT EMITTING MODULE AND LIGHTING DEVICE USING THE SAME

TECHNICAL FIELD

The present invention relates to a light emitting module in which an organic EL device is used as a light source and to a lighting device using the light emitting module.

BACKGROUND ART

An organic EL device emits light of high intensity at a low voltage, provides various emission colors depending on the type of organic compound contained therein, and is easily manufactured as a plate-like surface emitting panel. As shown in FIG. 7, there is known such a surface emitting panel 10 including a substrate 11, an organic EL device 12 provided at the center of the substrate 11, and a number of electrode pads 13 provided around the organic EL device 12 on the substrate 11 (refer to Japanese Laid-open Patent Publication No. 2012-182129). Each of the number of electrode pads 13 is electrically connected to either the anode layer or the cathode layer (not shown) of the organic EL device 12 and mediates the power supply from an external power source to the anode layer or the cathode layer. In the surface emitting panel 10, the region corresponding to the organic EL device 12 acts as a light emitting region 10A, which emits light, while the region corresponding to the electrode pads 13 around the organic EL device 12 (dotted region) acts as a non-light emitting region 10B, which does not emit light.

As shown in FIG. 8, there is known a light emitting module 101 in which a surface emitting panel 10 as described above is used as a light source (refer to Japanese Laid-open Patent Publication No. 2011-108568). The light emitting module 101 comprises a housing 60 that holds the surface emitting panel 10 and a light transmissive member 70 located at the light emitting surface side of the surface emitting panel 10. The light transmissive member 70 and the substrate 11 of the surface emitting panel 10 are bonded to each other by a light transmissive resin 80. Light emitted from the surface emitting panel 10 is transmitted through the light transmissive resin 80 and the light transmissive member 70 and emitted to the outside.

However, in the light emitting module 101 described above, a region in front of the non-light emitting region 10B is a dark region where the illumination light intensity is low while a region in front of the light emitting region 10A is a bright region where the illumination light intensity is high. Thus, the light emission area where light is emitted is small. Further, for example, in the case where a number of light emitting modules 101 are arranged in a matrix, the illumination surface has a mix of bright and dark regions to be non-uniform and thus it is not attractive in appearance.

SUMMARY OF THE INVENTION

The present invention has been made in view of the above described problems. An object of the present invention is to provide a light emitting module that allows the light emission area to be increased and further allows a uniform illumination surface to be achieved.

In order to solve the above described problems, the present invention provides a light emitting module including: a surface emitting panel having a light emitting surface on one side; and a plate-like optical member that is located over the light emitting surface of the surface emitting panel, wherein the surface emitting panel has a light emitting region that emits light and a non-light emitting region that is located around the light emitting region and does not emit light, the optical member has: a light transmissive substrate that receives light from the surface emitting panel to guide and emit the light; and a reflector that is provided in a region corresponding to the light emitting region on a light emission surface of the light transmissive substrate so as to reflect light, and the reflector has a reflectivity distribution in which average reflectance per unit area varies in a direction parallel to a surface of the optical member.

Preferably, in the reflectivity distribution, average reflectance per unit area varies in a range of 0-50%.

Preferably, in the above light emitting module, the reflector has a reflectivity distribution in which the average reflectance increases toward the non-light emitting region.

Preferably, in the above light emitting module, the reflector is not provided in a region corresponding to the non-light emitting region or the reflector has a reflectivity distribution in which the average reflectance decreases toward a periphery of the region corresponding to the non-light emitting region.

Preferably, in the above light emitting module, further comprising a diffuse transmitter that is located over the light emission surface of the light transmissive substrate and the reflector so as to diffuse light.

Preferably, in the above light emitting module, the diffuse transmitter is formed as a member which is different from the optical member.

Preferably, in the above light emitting module, the reflectivity distribution is set by varying area density of a reflective layer formed on the light emission surface of the light transmissive substrate.

Preferably, in the above light emitting module, the optical member further has a side reflector, which reflects light, on a side thereof.

Preferably, in the above light emitting module, the optical member and the surface emitting panel are adhered or bonded to each other by a light transmissive resin.

Preferably, the above light emitting module is used in a lighting device.

According to the present invention, since the reflector is provided in the region corresponding to the light emitting region of the light transmissive substrate, light emitted from the surface emitting panel and guided by the optical member is reflected by the reflector and emitted in front of the non-light emitting region. By this way, a region in front of the non-light emitting region is difficult to be dark, thus allowing the light emission area to be increased. Further, where a number of light emitting modules are arranged in a matrix as a lighting device, a uniform illumination surface is provided.

DETAILED DESCRIPTION

Figure 1:
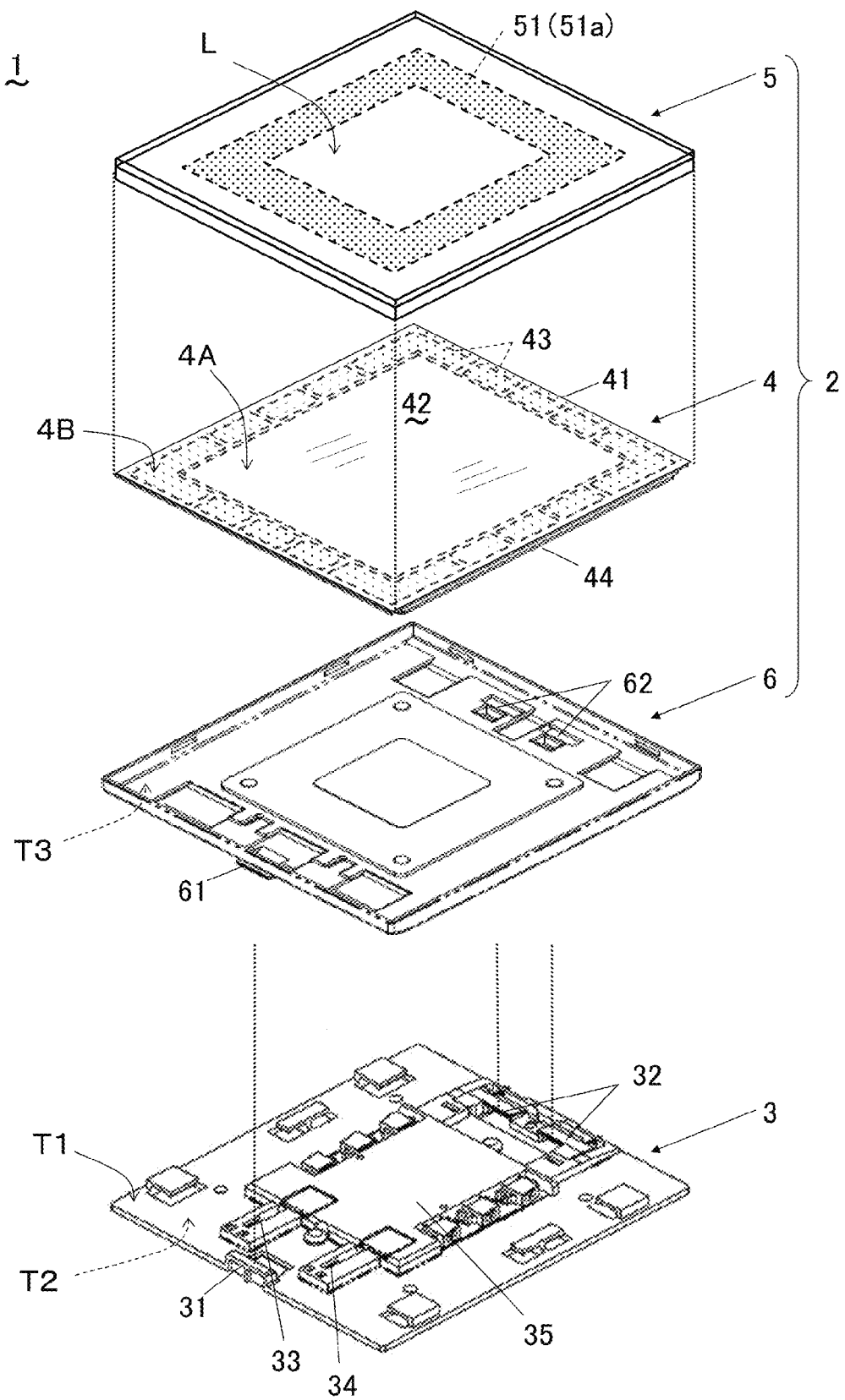
FIG. 1 is an exploded perspective view of a light emitting module according to a first embodiment of the present invention.
Figure 2:
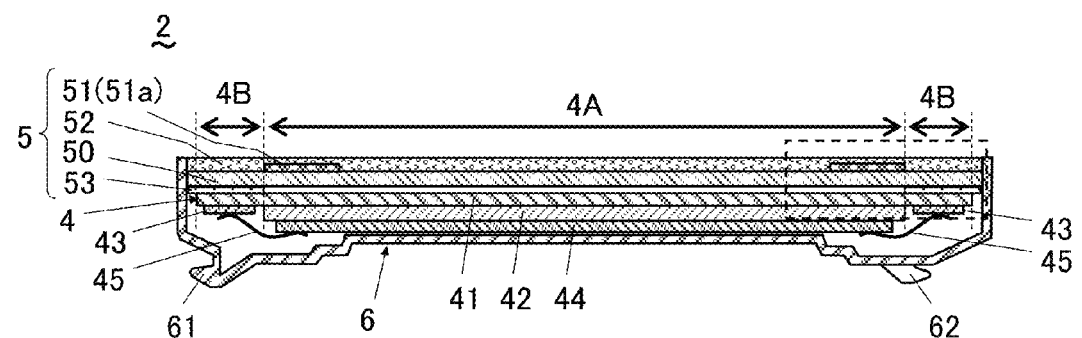
FIG. 2A is a cross sectional view of a light source included in the above light emitting module and FIG. 2B is an enlarged view of the region enclosed by a dashed line in FIG. 2A.
Figure 2:
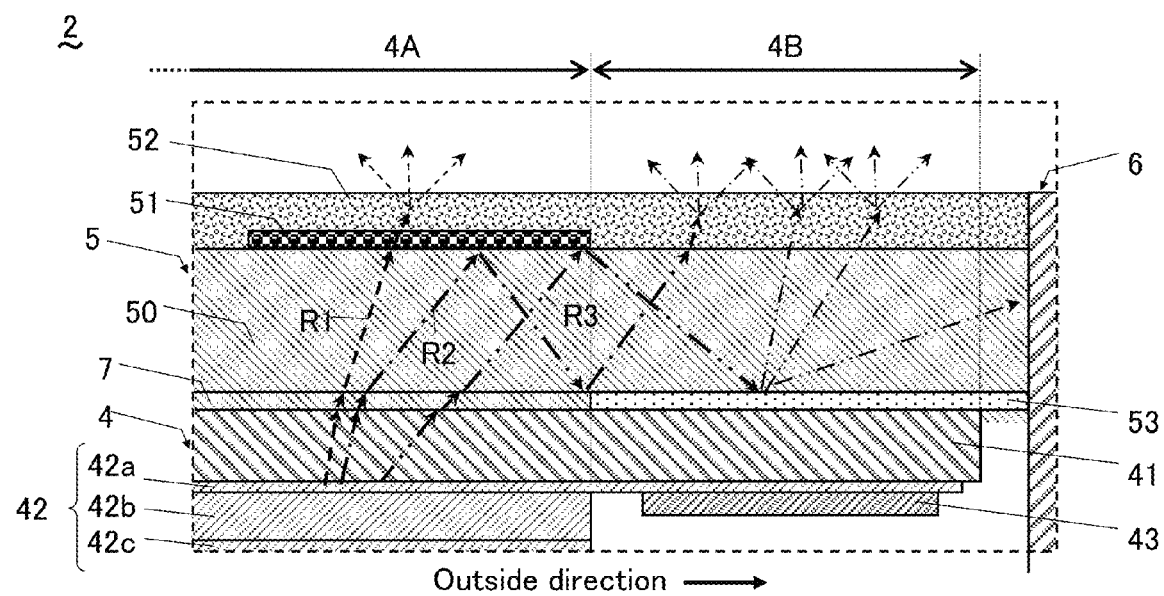
Figure 3:
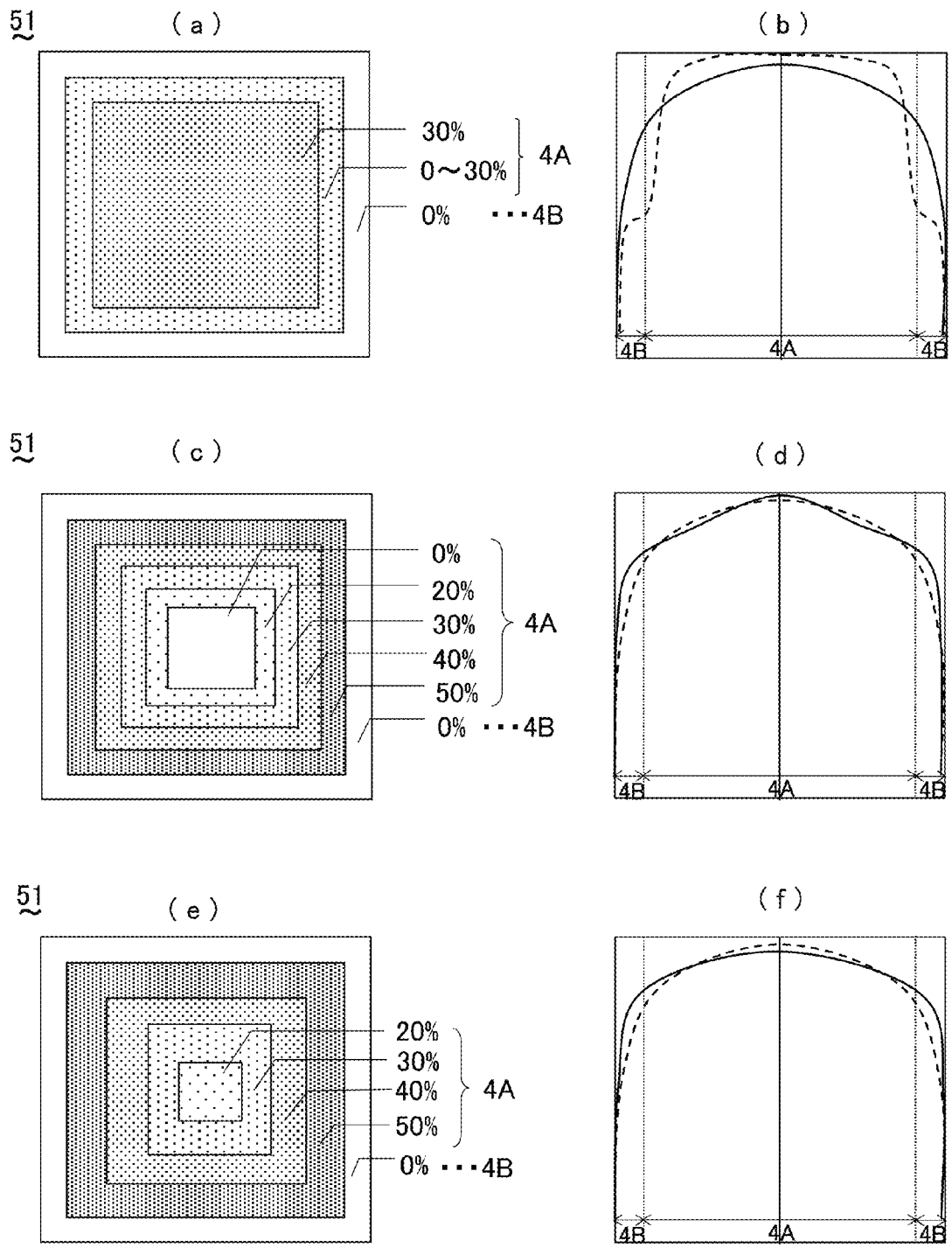
FIG. 3A is a top view showing an example of reflectivity distribution in a reflector.
FIG. 3B shows a light distribution curve in the reflectivity distribution of FIG. 3A.
FIG. 3C is a top view showing another example of reflectivity distribution in the reflector.
FIG. 3D shows a light distribution curve in the reflectivity distribution of FIG. 3C.
FIG. 3E is a top view showing a further example of reflectivity distribution in the reflector.
FIG. 3F shows a light distribution curve in the reflectivity distribution of FIG. 3E.

Referring to FIGS. 1 to 3, a light emitting module according to a first embodiment of the present invention is described. As shown in FIG. 1, the light emitting module 1 includes a light source 2 and a mounting unit 3 on which the light source 2 is detachably mounted.

The mounting unit 3 is rectangular and plate-like, and its surface facing the light source 2 serves as a mounting surface (T1) on which the light source 2 is mounted while the surface opposite to the mounting surface (T1) serves as a fixing surface (T2) that is fixed to an installation surface such as a ceiling or wall. The mounting unit 3 has a holding portion 31 and an engaging portion 32, which are used for engagement with the light source 2, on the mounting surface. In the example shown in FIG. 1, a single holding portion 31 is provided at the center of one side of the mounting surface (T1) and two engaging portions 32 are provided at the center of the side opposite to the one side. The mounting unit 3 further has a pair of terminal receiving portions 33 and 34 for insertion of each of a pair of power-supply terminals (not shown), which are provided on the light source 2 and used for power supply to the light source 2, and a circuit board 35 that is electrically connected to the terminal receiving portions 33 and 34 so as to control the power supply from an external power source to the light source 2.

The light source 2 is shaped as a rectangular and plate-like configuration, and its surface facing the mounting unit 3 serves as a mounting surface (T3) that is mounted on the mounting unit 3 while the surface opposite to the mounting surface serves as a light emitting surface (L). In the description below, the light emitting surface side and the mounting surface side are referred to as the upper side and the lower side, respectively, in accordance with FIG. 1. The light source 2 has a surface emitting panel 4 having a light emitting surface on the upper side (one side) and a plate-like optical member 5 located at the upper side (light emitting surface side) of the surface emitting panel 4 (also refer to FIG. 2A). The surface emitting panel 4 and the optical member 5 are held by a rear case 6 from the lower side of the surface emitting panel 4 in a manner such that the upper surface of the optical member 5 is exposed to the outside.

The surface emitting panel 4 has a rectangular and plate-like substrate 41, a rectangular organic EL device 42 provided at the center of the lower surface of the substrate 41, a number of electrode pads 43 provided around the organic EL device 42 at the lower surface of the substrate 41, and a wiring board 44 provided at the lower side of the organic EL device 42.

The substrate 41 is constituted by a light transmissive material, for example, a transparent glass plate. The organic EL device 42 has a common layered structure. In the illustrated example (refer to FIG. 2B), an anode layer $42a$, an organic layer $42b$ containing an organic luminescent material, and a light-reflective cathode layer $42c$ are stacked from the substrate 41 side. Each of the anode and cathode layers $42a$ and $42c$ is extended through the layer itself or an auxiliary electrode (not shown) to the outside of the organic layer $42b$, and the electrode pads 43 are provided on the extended portions. Each of the electrode pads 43 is electrically connected to the wiring board 44 through a conductive wire 45 (refer to FIG. 2A). The wiring board 44 has the pair of power supply terminals (not shown) described above. Electric power supplied to the wiring board 44 through the power supply terminals from the circuit board 35 of the mounting unit 3 is supplied to the organic EL device 42 through the conductive wire 45 and the electrode pad 43. By arranging the electrode pads 43 around the organic EL device 42, a voltage is uniformly applied to the organic EL device 42 so that the organic EL device 42 emits light with uniform brightness.

In the above configured surface emitting panel 4, the region where the organic EL device 42 is located acts as a light emitting region 4A that emits light. On the other hand, the region around the organic EL device 42 where the electrode pads 43 are located (shown dotted in FIG. 1) acts as a non-light emitting region 4B that does not emit light.

The optical member 5 has a light transmissive substrate 50 that receives light from the surface emitting panel 4 to guide and emit the light. The light transmissive substrate 50 is shaped as a rectangular plate of substantially the same size as the substrate 41 of the surface emitting panel 4 and comprises a light transmissive material such as, for example, a transparent glass plate or a transparent acrylic resin plate. Further, the light transmissive substrate 50 has a reflector 51, which reflects light, in the region corresponding to the light emitting region 4A on the surface (upper surface) opposite to the surface facing the surface emitting panel 4. The reflector 51 is formed on the light transmissive substrate 50 by silk screen printing with reflective paint such as, for example, barium sulfate or titanium oxide for deposition of a reflective layer $51a$. In this example, it is preferable that the reflector 51 is not provided in the region corresponding to the non-light emitting region 4B or that the reflector 51 has a reflectivity distribution in which the average reflectance decreases toward the periphery of the region corresponding to the non-light emitting region 4B.

Further, the reflector 51 has a reflectivity distribution in which the average reflectance per unit area varies in a direction parallel to the surface of the optical member 5. This reflectivity distribution is set so that the average reflectance per unit area varies, for example, in the range of 0-50%, by varying the area density of the reflective layer $51a$ formed on the light emission surface of the light transmissive substrate 50. More particularly, the above described silk screen printing allows the average reflectance in the reflective layer $51a$ to be set to an appropriate value and allows the average reflectance to be appropriately varied in a direction parallel to the surface of the optical member 5, by varying the number of dots of reflective paint per unit area. When the average reflectance is greater than 50%, the brightness in the region in front of the region where the reflector 51 is formed is lowered and thus uneven brightness of the light emission surface is likely to occur in the light emitting module 1.

In the illustrated example, the reflective layer $51a$ having a predetermined width is formed in a frame shape by silkscreen printing in the region corresponding to the periphery of the light emitting region 4A, and there is no reflective layer $51a$ in the central region of the light emitting region 4A as well as in the region corresponding to the periphery of the non-light emitting region 4B. Assuming that the average reflectance of the reflective layer $51a$ shown in the drawings is 30%, the reflectivity distribution on the light transmissive substrate 50 from the center of the optical member 5 toward the non-light emitting region 4B changes from 0% to 30% to 0%.

The optical member 5 further has a diffuse transmitter 52 that is located over the light emission surface of the light transmissive substrate 50 and the reflector 51 so as to diffuse light. This diffuse transmitter 52 is made, for example, by forming a light transmissive resin such as acrylic resin containing reflective particles such as titanium oxide or by forming fine concavities and convexities on the surface of a light transmissive resin.

Further, the optical member 5 has a diffuse reflector 53, which reflects and diffuses light, in the region corresponding to the non-light emitting region 4B on the surface (lower surface) facing the surface emitting panel 4. The diffuse reflector 53 is formed, for example, by applying white paint or applying white tape on the periphery of the lower surface of the optical member 5, but it may be configured in other ways as long as light can be reflected and diffused.

The rear case 6 is shaped like an open topped box and holds the surface emitting panel 4 and the optical member 5 therein. The rear case 6 has a held portion 61, which engages with the holding portion 31 of the mounting unit 3, and an engaged portion 62, which engages with the engaging portion 32 of the mounting unit 3, at the outer portion of the lower surface.

The substrate 41 (surface emitting panel 4) and the optical member 5 are adhered or bonded to each other by a light transmissive resin 7. For example, the light transmissive resin 7 comprises a material having the same refractive index as the material of the substrate 41 or as the material of the optical member 5, or comprises a material having a refractive index intermediate between those of the materials. By this way, total reflection at the interface between the substrate 41 and the light transmissive resin 7 as well as at the interface between the light transmissive resin 7 and the optical member 5 are prevented, thereby enhancing light extraction efficiency.

In the above configured light emitting module 1, light emitted from the organic EL device 42 passes through the substrate 41, and most of the light enters the diffuse transmitter 52 to be diffused by the diffuse transmitter 52 and emitted to the outside while part of the light enters the reflector 51. The reflector 51 has a reflectivity distribution in which the average reflectance per unit area is in the range of 0-50%. Thus, for example, when the average reflectance is 30%, 70% of incident light passes through the reflector 51 and 30% is reflected.

According to the above described configuration, most of light entering the reflector 51 passes through the reflector 51 and enters the diffuse transmitter 52 to be diffused by the diffuse transmitter 52 and emitted to the outside, like light R1 shown by dashed arrow in FIG. 2B. Part of light entering the reflector 51 is reflected from the reflector 51 and totally reflected at the interface between the light transmissive substrate 50 and the light transmissive resin 7 so as to be guided outward, and enters the diffuse transmitter 52 to be diffused by the diffuse transmitter 52 and emitted to the outside in front of the non-light emitting region 4B, like light R2 shown by alternate long and short dash arrow in FIG. 2B. Further, light reflected by the reflector 51, for example, light R3 shown by alternate long and two short dashes arrow, is guided outward within the optical member 5 to reach the non-light emitting region 4B and is reflected and diffused by the diffuse reflector 53 to be emitted to the outside in front of the non-light emitting region 4B.

According to the light emitting module 1 of this embodiment, the reflector 51 provided at the region corresponding to the light emitting region 4A in the optical member 5 enables light emitted from the surface emitting panel 4 to be guided outward within the light transmissive substrate 50 and then emitted in front of the non-light emitting region 4B. By this way, a region in front of the non-light emitting region 4B is difficult to be dark, thus allowing the light emission area, where light is emitted, to be increased. Further, where a number of such light emitting modules 1 are arranged in a matrix as a lighting device, there is no dark region due to the non-light emitting region 4B between adjacent light emitting modules 1. Therefore, a uniform and large illumination surface as a whole are provided.

Moreover, since the module further has the diffuse transmitter 52, light emitted in front of each of the light emitting region 4A and the non-light emitting region 4B is diffused. This reduces brightness difference at the boundary between the light emitting region 4A and the non-light emitting region 4B, thus reducing uneven brightness at the light emission surface of the module.

The reflector 51 is not limited to the example shown in the above described drawings, in which the average reflectance at the periphery of the light emitting region 4A is higher, but it may be formed so as to have a predetermined reflectivity distribution. As shown in FIG. 3A, in an example of a reflectivity distribution, the average reflectance at the central region of the light emitting region 4A is 30%, a reflectivity gradient layer where the average reflectance varies in the range of 0-30% is provided around the central region, and the average reflectance at the non-light emitting region 4B is 0%. This reflectivity distribution increases light guided outward from the center of the device and further increases light coming out from the non-light emitting region 4B, as the light distribution curve shown by solid line in FIG. 3B, because the region in which the average reflectance is lower is present at the periphery of the light emitting region 4A. On the other hand, the dashed line in FIG. 3B shows the light distribution curve when the reflector 51 is not formed. As can be seen, when the reflector 51 has the reflectivity distribution in which the average reflectance increases toward the non-light emitting region 4B, light is guided further outward so that light coming out from the non-light emitting region 4B is increased. It is to be noted that although the reflectivity gradient layer where the average reflectance varies in the range of 0-30% is provided in the above described example, the average reflectance of the reflectivity gradient layer may be, for example, 0-40% or 0-50% and the average reflectance at the center of the light emitting region 4A may be 40% or 50%.

As shown in FIG. 3C, in another example of a reflectivity distribution, the average reflectance at the central region of the light emitting region 4A is 0%, a reflectivity gradient layer where the average reflectance is gradually varied in the range of 0-50% is provided around the central region, and the average reflectance at the non-light emitting region 4B is 0%. According to this reflectivity distribution, light coming out from the non-light emitting region 4B is increased while decrease in brightness at the central region is prevented, as the light distribution curve shown by solid line in FIG. 3D. On the other hand, the dashed line in FIG. 3D shows the light distribution curve in the reflector 51 shown in FIG. 3B.

As shown in FIG. 3E, in another example of a reflectivity distribution, the average reflectance at a smaller central region of the light emitting region 4A is 20%, a reflectivity gradient layer where the average reflectance is gradually varied in the range of 30-50% is provided around the smaller central region, and the average reflectance at the non-light emitting region 4B is 0%. According to this reflectivity distribution, light coming out from the non-light emitting region 4B is further increased, as the light distribution curve shown by solid line in FIG. 3F. On the other hand, the dashed line in FIG. 3F shows the light distribution curve in the reflector 51 shown in FIG. 3B.

Figure 4:
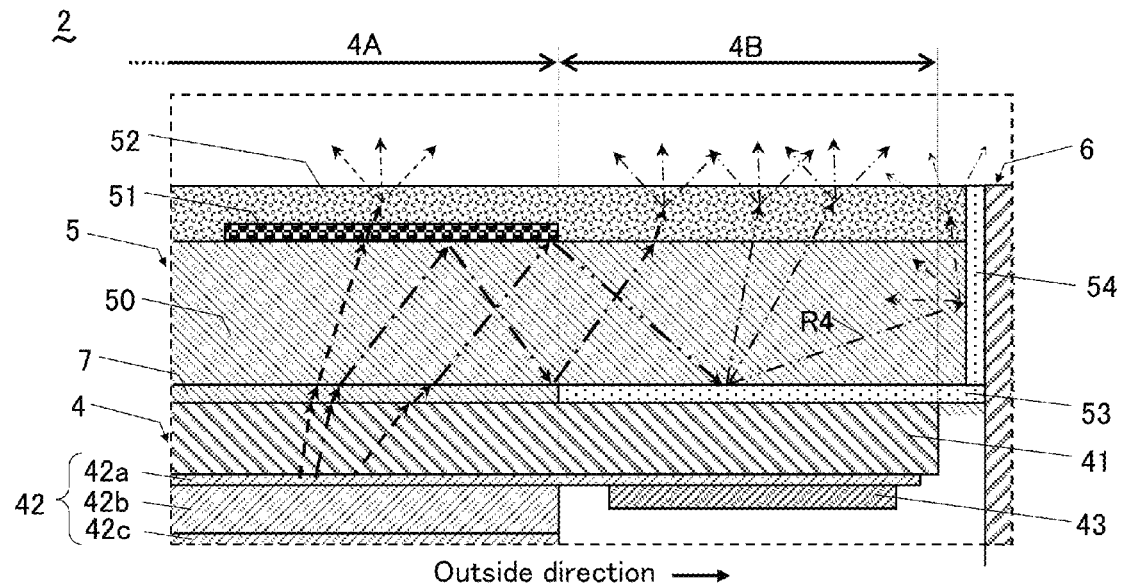
FIG. 4 is an enlarged sectional view of a part of a light source included in a light emitting module according to a modified example of the above embodiment.

Referring now to FIG. 4, a light source included in a light emitting module according to a modified example of the above embodiment is described. The light source 2 in this modified example further comprises a side reflector 54 provided on the side of the optical member 5 so as to reflect light. The other configuration is similar to that shown in FIG. 2A above. Like the diffuse reflector 53, the side reflector 54 is formed by applying white paint or applying white tape. By providing this side reflector 54, light R4 (shown by dashed line in FIG. 4) guided outward within the optical member 5 is reflected and diffused by the side reflector 54 to be emitted to the outside. This further increases the intensity of illumination light at the periphery of the optical member 5.

Figure 5:
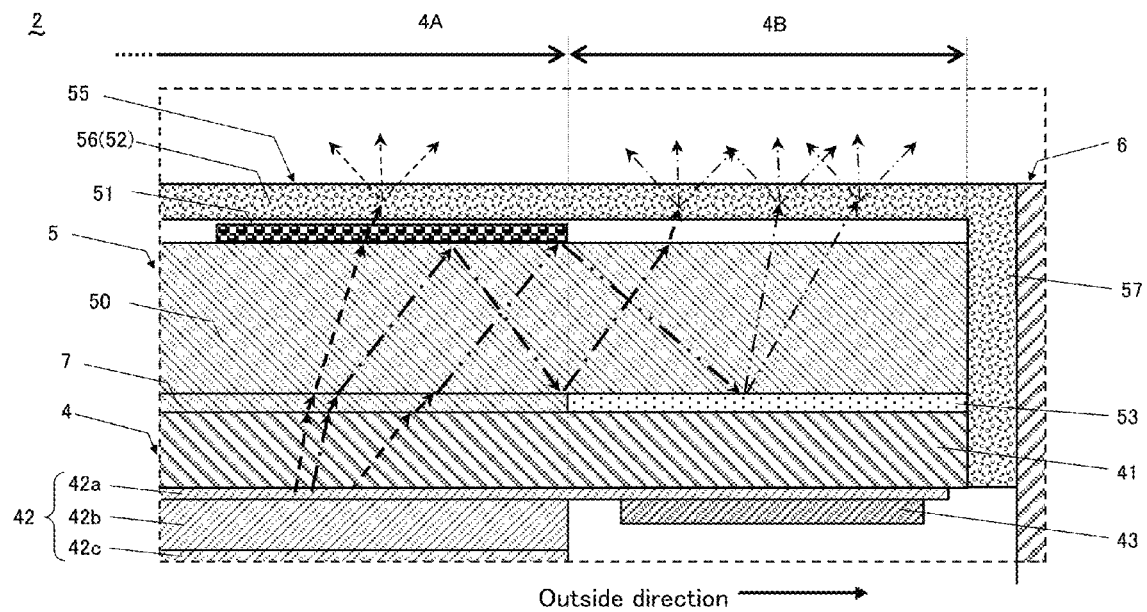
FIG. 5 is an enlarged sectional view of a part of a light source included in a light emitting module according to another modified example of the above embodiment.
Figure 6:
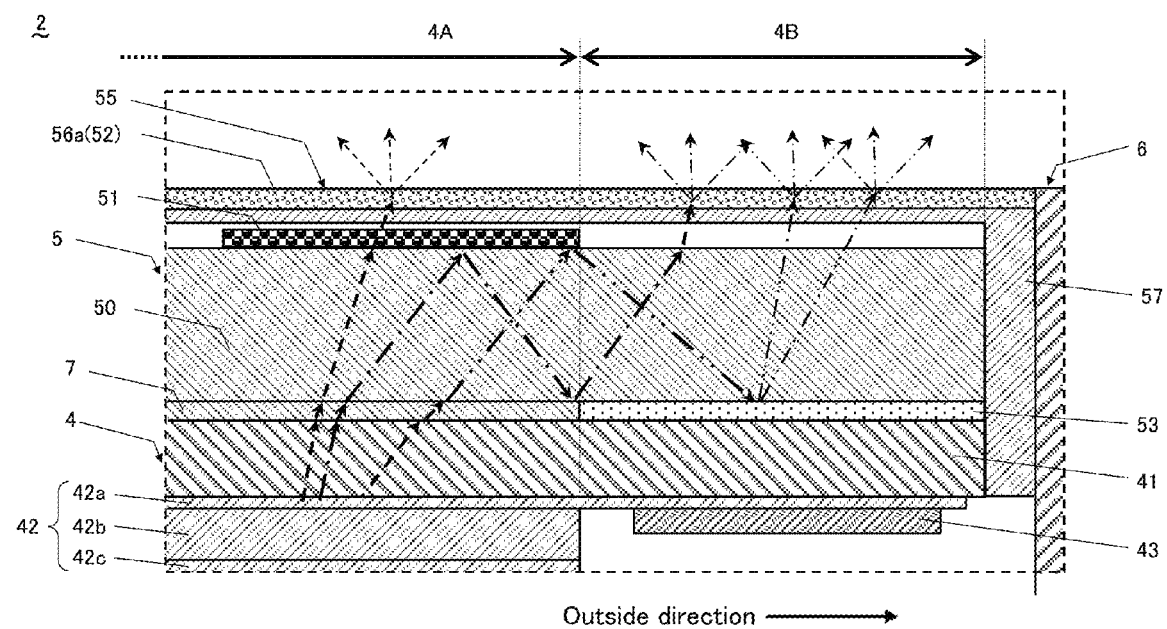
FIG. 6 is an enlarged sectional view of a part of a light source included in a light emitting module according to more another modified example of the above embodiment.
Figure 7:
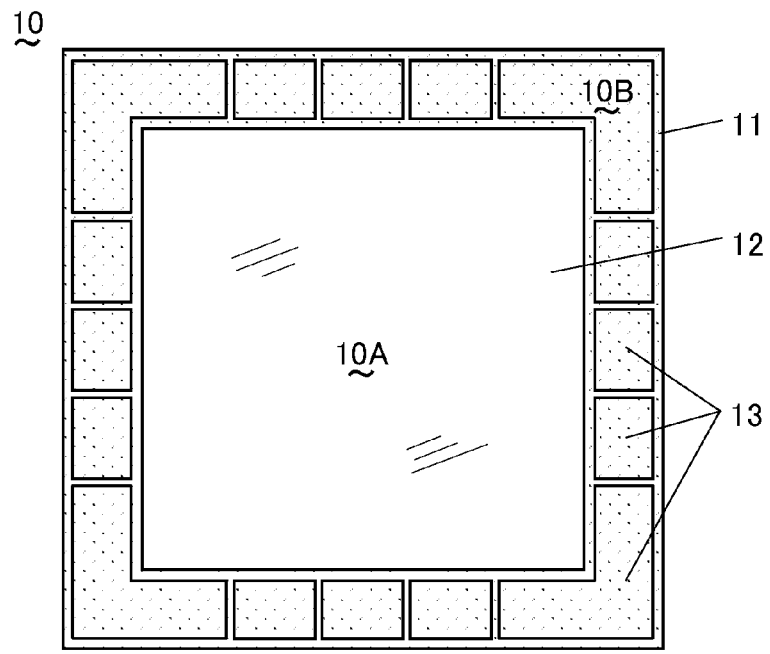
FIG. 7 is a plan view of a common surface emitting panel.
Figure 8:
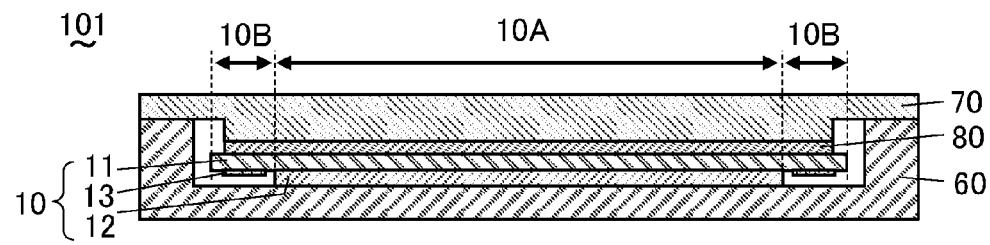
FIG. 8 is a cross sectional view of a conventional light emitting module using the above common surface emitting panel.

Referring now to FIGS. 5 and 6, two types of light sources included in light emitting modules according to an another modified examples of the above embodiment are described. The light source 2 in these modified examples comprise a diffuse transmitter 52 that is formed as a member which is different from the optical member 5 respectively. Concretely, the light sources 2 further comprise a light transmissive holding member 55 that is located over the optical member 5. The light transmissive holding member 55 has a flat portion 56 that is located so as to face to the optical member 5 and a supporting portion 57 that is provided to stand straight for outer circumferences of the emitting panel 4 and the optical member 5 from a periphery of the flat portion 56. The supporting portion 57 supports the flat portion 56 so that a slight gap is formed between the flat portion 56 and the optical member 5 (the reflector 51). The supporting portion 57 is formed so that the inner size of The supporting portion 57 becomes the approximately same as the outer sizes of the emitting panel 4 and the optical member 5.

In the modified example shown in FIG. 5, the light transmissive holding member 55 is formed of a light transmissive resin material such as acrylic resin which incorporated reflectivity particles such as titanium oxide, and the flat portion 56 functions as the diffuse transmitter 52. In the another modified example shown in FIG. 6, the light transmissive holding member 55 in itself is formed of the light transmissive resin materials, and a diffuse layer 56a that is formed by the application of the resin materials containing a reflectivity particle to the flat portion 56 is established.

In the above embodiments, when the reflector 51 is formed by the above silk printing, and a diffuse transmitter 52 is formed on the reflector 51 directly, a dot pattern may project to an appearance of the light source 2. On the other hand, according to the modified examples shown in FIGS. 5 and 6, by the providing the slight gap is formed between the diffuse transmitter 52 (the flat portion 56 or the diffuse layer 56a) and the reflector 51, the dot pattern of the reflector 51 is difficult to project to an appearance of the light source 2, and uneven brightness is reduced effectively.

Additionally, the supporting portion 57 supports the emitting panel 4 and the optical member 5 so as to hold them, a position gap with the emitting panel 4 and the optical member 5 is prevented.

a side reflector 54 provided on the side of the optical member 5 so as to reflect light. The other configuration is similar to that shown in FIG. 2A above. Like the diffuse reflector 53, the side reflector 54 is formed by applying white paint or applying white tape. By providing this side reflector 54, light R4 (shown by dashed line in FIG. 4) guided outward within the optical member 5 is reflected and diffused by the side reflector 54 to be emitted to the outside. This further increases the intensity of illumination light at the periphery of the optical member 5.

The light emitting module according to the prevent invention is not limited to the above embodiment and its modified example but various modifications may be made. For example, based on the above described light source 2, a diffuse reflector 53 may be extended into the light emitting region 4A while a light transmissive resin is provided between a surface emitting panel and a light transmissive substrate.

The invention claimed is:

1. A light emitting module comprising:
   a surface emitting panel having a light emitting surface on one side; and
   a plate-like optical member that is located over the light emitting surface of the surface emitting panel, wherein
   the surface emitting panel has a light emitting region that emits light and a non-light emitting region that is located around the light emitting region and does not emit light,
   the optical member has: a light transmissive substrate that receives light from the surface emitting panel to guide and emit the light; and a reflector that is provided in a region corresponding to the light emitting region on a light emission surface of the light transmissive substrate so as to reflect light, and
   the reflector has a reflectivity distribution in which average reflectance per unit area varies in a direction parallel to a surface of the optical member.

2. The light emitting module according to claim 1, wherein, in the reflectivity distribution, average reflectance per unit area varies in a range of 0-50%.

3. The light emitting module according to claim 1, wherein the reflector has a reflectivity distribution in which the average reflectance increases toward the non-light emitting region.

4. The light emitting module according to claim 1, wherein the reflector is not provided in a region corresponding to the non-light emitting region or the reflector has a reflectivity distribution in which the average reflectance decreases toward a periphery of the region corresponding to the non-light emitting region.

5. The light emitting module according to claim 1, further comprising a diffuse transmitter that is located over the light emission surface of the light transmissive substrate and the reflector so as to diffuse light.

6. The light emitting module according to claim 5, wherein the diffuse transmitter is formed as a member which is different from the optical member.

7. The light emitting module according to claim 1, wherein the reflectivity distribution is set by varying area density of a reflective layer formed on the light emission surface of the light transmissive substrate.

8. The light emitting module according to claim 1, wherein the optical member further has a side reflector, which reflects light, on a side thereof.

9. The light emitting module according to claim 1, wherein the optical member and the surface emitting panel are adhered or bonded to each other by a light transmissive resin.

10. A lighting device using the light emitting module according to any one of claims 1 to 9.

\* \* \* \* \*